United States Patent [19]
McClure

[11] Patent Number: 5,629,896
[45] Date of Patent: May 13, 1997

[54] WRITE CONTROLLED ADDRESS BUFFER

[75] Inventor: David C. McClure, Carrollton, Tex.

[73] Assignee: SGS-THOMSON Microelectronics, Inc., Carrollton, Tex.

[21] Appl. No.: 521,800

[22] Filed: Aug. 31, 1995

[51] Int. Cl.$^6$ .................................................. G11C 7/00
[52] U.S. Cl. .................. 365/189.05; 365/230.08; 365/233.5
[58] Field of Search ................ 365/189.05, 230.08, 365/233.5, 190

[56] References Cited

U.S. PATENT DOCUMENTS

| | | | |
|---|---|---|---|
| 5,124,584 | 6/1992 | McClure | 307/480 |
| 5,469,385 | 11/1995 | Smith et al. | 365/189.05 |

*Primary Examiner*—David C. Nelms
*Assistant Examiner*—Huan Hoang
*Attorney, Agent, or Firm*—Theodore E. Galanthay; Lisa K. Jorgenson; Peter J. Thoma

[57] ABSTRACT

An input buffer, for an asynchronous integrated memory circuit incorporating a memory circuit, including a latch circuit controlled by a write enable signal is disclosed. The input stage of the input buffer is connected to a pass gate, which is controlled by the write enable signal so that the pass gate is nonconductive when the write enable signal is active. The output of the pass gate is connected to an input of the latch circuit. The latch circuit is controlled by the write enable signal so that the signal present on the input of the latch is latched when the write enable signal is active. From an output of the latch circuit are obtained true and complementary signals, which are applied to outputs of the buffer circuit. As a result, when the write enable signal is active, the signal present on the input of the buffer is latched and presented to the outputs of the buffer, and the latch circuit is isolated from the input of the buffer until the write cycle is terminated.

26 Claims, 2 Drawing Sheets

WRITE CONTROLLED ADDRESS BUFFER

BACKGROUND OF THE INVENTION

1. Field of the Invention

The present invention relates in general to integrated circuits, and more particularly to input buffers in memory circuits. Still more particularly, the present invention relates to address buffers.

2. Description of the Prior Art

Many modern integrated circuits are designed to perform their operations in response to input signals which are applied to terminals at relatively high frequencies and in an asynchronous or unclocked manner. One type of such integrated circuits is a static random access memory, commonly referred to as an asynchronous SRAM. Asynchronous SRAM's are designed to receive address values at address terminals, and to statically provide read or write access to the memory cells corresponding to the value of the address applied thereto. Accordingly, such asynchronous SRAM circuits are designed to quickly respond to the address value applied thereto, without relying on a clock signal indicating that the value at its address terminals is valid. In order to provide the performance benefits of internal dynamic operation, many modern asynchronous SRAMs include an address transition detection (ATD) circuit. The ATD circuit detects transitions at certain inputs to the SRAM, particularly the address terminals, and generates an internal signal responsive to detecting such a transition. The use of an ATD circuit allows the SRAM circuit to perform certain internal operations, such as precharging bit lines, deselecting sense amplifiers, and the like, after detection of the address transition, but before the decoders access the desired cell.

Address buffers are used, in conjunction with decoders, to select row or bit lines within a memory array during read and write operations. In particular, during a write cycle, an address value is applied and maintained to inputs of address terminals, and the input data bits are applied to data terminals of the memory. The write enable input of the SRAM is brought active to effect the write operation. The timing diagram of a typical write cycle is shown in FIG. 1. As can be seen, the address signals are setted at time $t_0$ and must be held at same levels until the completion of write, for all the write cycle time $t_{WC}$. Then, after a predetermined time, shown as setup time in FIG. 1, the write_bar signal is brought low. This setup time is necessary to be sure that logic values at address inputs are valid and stable when the write signal is enabled. Analogously address values must be held at same levels for a hold time after the write_bar signal returns high.

This timing, used in conventional asynchronous SRAM memories, can be a constraint for some systems (for example memory controllers and microprocessors) in which the requirement to maintain address signals for a long time can be a problem. Setup and hold times must be met which imposes more constraints on the system. Also, if the system operates in a noisy environment, the address signals may vary during the write cycle and cause an incorrect cell to be written. Indeed, it has been shown through testing, that the most critical operation mode that affects input levels is the write cycle, in which an unstable level can cause an incorrect cell to be written. Additional problems may also be caused by high frequency address transitions during a write operation, caused by noise at the address terminals of sufficient amplitude to cause a transition during such a write operation.

An example of an input buffer, designed to solve the problem of high frequency address transitions at the address terminals of a memory device is described in U.S. Pat. No. 5,124,584, entitled *Address buffer circuit with transition-based latching*, assigned to SGS THOMSON Microelectronics Inc., and incorporated herein by this reference. An input buffer, which includes an address transition detection (ATD) circuit, is disclosed therein. The input stage of this input buffer is connected to a delay stage, and to a transition detection circuit. The output of the delay stage is connected to a pass gate, which is controlled by the output of the transition detection circuit; a latch is connected to the other side of the of the pass gate. The transition detection circuit produces a pulse responsive to a transition, and the pass gate is turned off during the length of the pulse, with the latch maintaining and presenting the state of the input prior to the transition. After the pulse is complete, the new value of the input signal is latched and presented to the circuit. Since the pass gate is turned off during the transition detection pulse, a short and spurious transition at the input terminal is isolated from the latch by the pass gate, and does not appear at the output of the input buffer circuit.

The input buffer of U.S. Pat. No. 5,124,584, while solving the problem of high frequency address transitions, incorporates a transition detection circuit; such circuit is quite complicated and requires, on the integrated circuit, a relatively large area in relation to the area of a conventional input buffer. Moreover this input buffer is not capable to recover from variations of the input signal longer then a limited time and not impulsive. System still needs to meet address setup and hold times and maintain stable addresses for the duration of the write.

It is therefore an object of the present invention to provide an input buffer for an asynchronous integrated memory circuit which is immune from any kind of transitions on its input during most part of a write cycle.

It is a further object of the present invention to provide control of the input buffers of an asynchronous integrated memory circuit in such a manner that timing constraints during a write cycle are greatly alleviated or eliminated.

Other objects and advantages of the present invention will be apparent to those of ordinary skill in the art having reference to the following specification together with its drawings.

SUMMARY OF THE INVENTION

The invention may be incorporated in a input buffer for an asynchronous integrated memory circuit incorporating a memory. The input buffer includes a latch circuit controlled by the write enable signal. The input stage of the input buffer is connected to a pass gate, which is controlled by the write enable signal so that the pass gate is nonconductive when the write enable signal is active. The output of the pass gate is connected to an input of the latch circuit. The latch circuit is controlled by the write enable signal so that the signal present on the input of the latch is latched when the write enable signal is active. From an output of the latch circuit are obtained two signals, a first true and a second complemented, which are applied to outputs of the buffer circuit. As a result, when the write enable signal is active, the signal present on the input of the buffer is latched and presented to the outputs of the buffer, and the latch circuit is isolated from the input of the buffer until the write cycle is terminated.

The characteristics and advantages of the circuit in accordance with the present invention are set forth in the description of an embodiment thereof given below by way of non-limiting example with reference to the annexed drawings.

DETAILED DESCRIPTION OF THE PREFERRED EMBODIMENT

Figure 1:
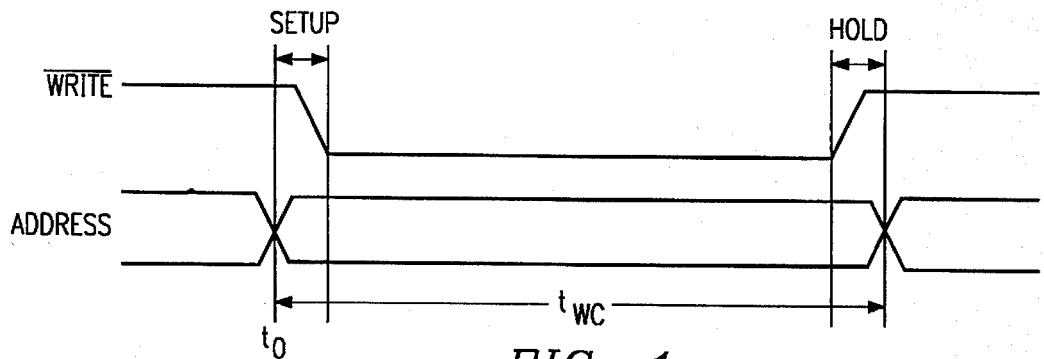
FIG. 1 is a timing diagram illustrating the timings required in a write cycle using a conventional input buffer.
Figure 2:
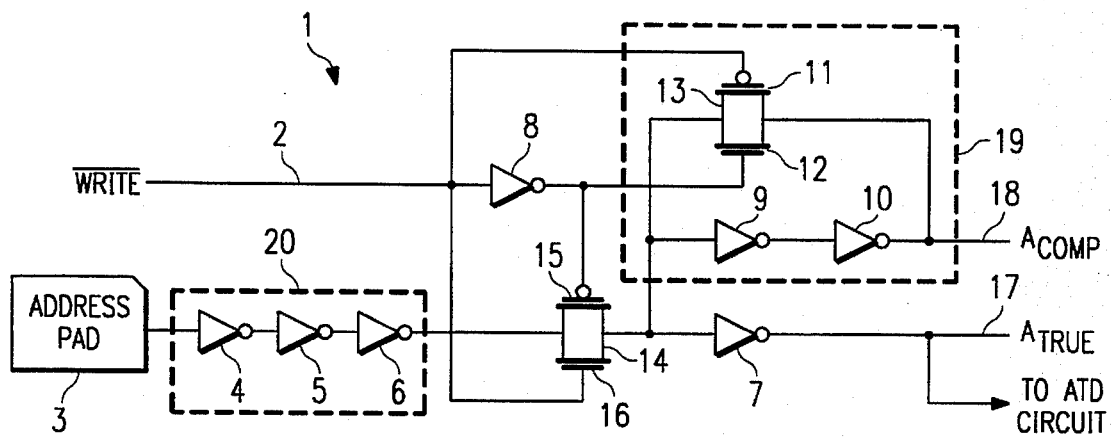
FIG. 2 is a schematic diagram of an input buffer according to the present invention.

FIG. 2 is an electrical diagram illustrating an input buffer 1 according to the present invention. Input buffer 1 has an input pad 3 for receiving an input signal, a control input 2 for receiving a write enable signal labeled write_bar (indicating active low), a true output signal line 17, labeled $A_{TRUE}$, and a complementary output signal line 18, labeled $A_{COMP}$. The output signals $A_{TRUE}$, $A_{COMP}$ on lines 17, 18, respectively, are intended to be complementary to one another.

The input address pad 3 is coupled, by means of an inverting stage 20 made of the series of a first inverter 4, a second inverter 5 and a third inverter 6, to an input of a first pass gate 14. Fourth inverter 7 is connected between output of pass gate 14 and the true output line 17, labeled $A_{TRUE}$. Pass gate 14 includes a p-channel transistor 15 having its source-drain path connected in parallel with the source drain path of an n-channel transistor 16; the gates of the p-channel and n-channel transistors in pass gate 14 are controlled by input line 2 (inverted by inverter 8 prior to application to the gate of the p-channel transistor 15), receiving the write enable signal write_bar.

Output of pass gate 14 is also connected to a controlled latch 19, which consists of two inverters 9 and 10 connected in series and a second pass gate 13 which connects the output of inverter 10 to input of inverter 9, cross-coupling the two inverters, when it is in conduction state. Pass gate 13 includes a p-channel transistor 11 having its source-drain path connected in parallel with the source drain path of an n-channel transistor 12; the gates of the p-channel and n-channel transistors in pass gate 13 are controlled by the input line 2 (inverted by inverter 8 prior to application to the gate of the n-channel transistor 12), receiving the write enable signal write_bar. Output of the inverter 10, present in the controlled latch 19, is connected to the complementary output line, labeled $A_{COMP}$.

Referring now to the timing diagram of FIG. 3, the operation of the input buffer circuit of FIG. 2 according to this preferred embodiment of the invention will now be described. The input buffer of FIG. 2 is used, in this embodiment, as an input buffer for an address signal in a memory device. At time $t_1$ starts a memory access with a transition at address terminal ADDRESS from the prior low logic level to a high logic level. At time $t_1$ the write_bar signal is high, pass gate 14 is conductive and pass gate 13 is non-conductive. Responsive to the transition of terminal ADDRESS, inverting logic stage 20 and inverters 7, 9 and 10 generate a high logic level on output $A_{TRUE}$ and a low logic level on output $A_{COMP}$. At time $t_2$ the write_bar signal becomes low, starting the write cycle. The pass gate 14, which couples the inverting logic stage 20 with the controlled latch circuit 19, at time $t_2$ is turned off by the write_bar signal. In this way the write enable signal, which is active low, isolates the input pad 3 from latch circuit 19 and the outputs of the buffer.

The latch circuit 19, which is connected to the output of the pass gate 14, is controlled by the write enable signal so that the signal present on the output of the pass gate 14 is latched when the write_bar signal becomes low at time $t_2$. The latched signal is applied to a first output $A_{COMP}$ and, inverted by the inverting gate 7, to a second output $A_{TRUE}$. Output signals $A_{TRUE}$ and $A_{COMP}$, shown in timing diagram of FIG. 3, maintain their logic state for all write cycle time, until signal write_bar returns high, even if the address signal on buffer's input changes level.

Figure 3:
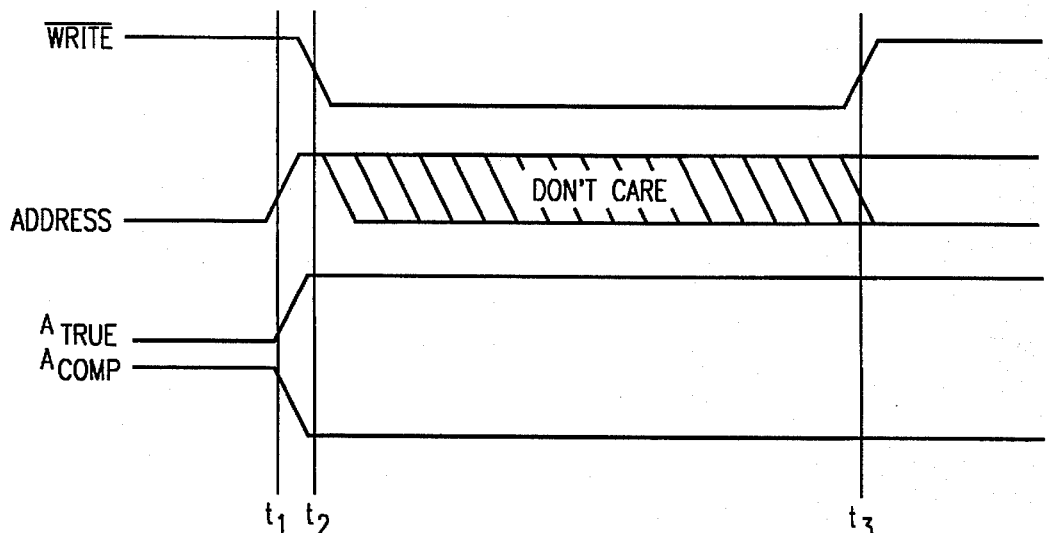
FIG. 3 is a timing diagram illustrating the timings required in a write cycle using an input buffer according to the present invention.

As a result, when the write enable signal is active, the address signal present on the input of the buffer is latched and presented, true and complemented, to the outputs of the buffer; simultaneously the latch circuit is isolated from the input of the buffer and remains isolated until the write cycle is terminated, at time $t_3$ on the timing diagram of FIG. 3.

The address transition detection (ATD) circuit, which normally is connected to inputs of address buffers in order to detect transitions on such inputs, if used in conjunction to the input buffer of FIG. 2 must be slightly modified or connected in a different way. In fact such ATD circuit must detect transitions before the write cycle starts, but must ignore transitions during all time the write_bar signal is active. In order to solve this problem, if ATD circuit is connected in a conventional way to inputs of address buffers, inputs of ATD circuit could be gated by the write_bar signal by a simple gating circuit or, as shown in this embodiment, ATD circuit can be connected to outputs of address buffers. As shown in FIG. 2, the output 17 of the input buffer 1 is also connected to an input of the ATD circuit.

During read cycles the write_bar signal is always at a high logic level maintaining the pass gate 14 on and the pass gate 13 off. In this condition the input buffer works as a conventional address buffer, generating a logic level corresponding to the input signal level on the output $A_{TRUE}$ and a complementary logic level on the output $A_{COMP}$.

Figure 4:
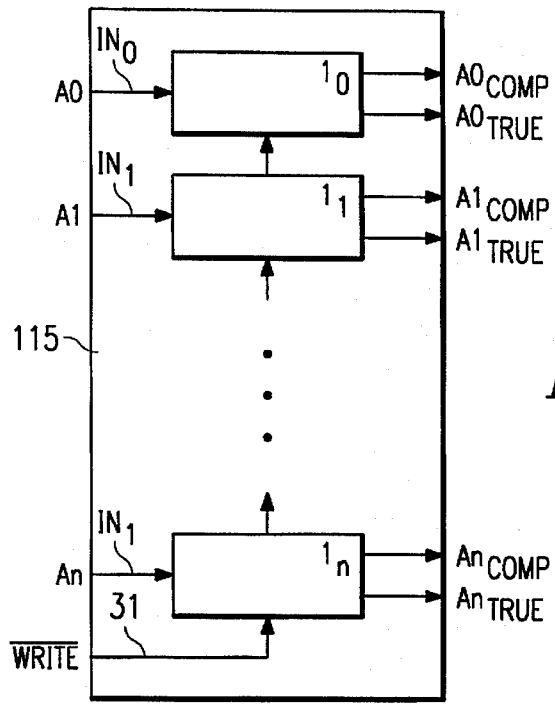
FIG. 4 is a block diagram of an address buffer according to the present invention.

FIG. 4 shows an address buffer 115 receiving a plurality of address signals $A0-A_n$ on its address inputs $IN_0-IN_n$. Address buffer 115 includes a plurality of input buffers $1_0-1_n$, each one is equivalent to the input buffer 1 described in FIG. 2. Each input buffer is connected to an address input and has two outputs, one true and one complemented, as described above for buffer of FIG. 2. Outputs $A0_{COMP}-An_{COMP}$ and $A0_{TRUE}-An_{TRUE}$ are presented to row and column decoders to control addressing of a memory array. Another input 31 of the address buffer 115 receives a write enable signal, labeled write_bar in FIG. 4, and is connected to corresponding inputs of all input buffers $1_0-1_n$ for controlling their operation.

Each input buffer 1 operates in the same way as the input buffer of FIG. 2 above described. As such, at the start of a new write cycle, address signals A0-An are applied to inputs $IN_0-IN_n$. Then the write_bar signal is brought low and, in each of the input buffers $1_0-1_n$, the corresponding address signal is latched in the internal latch circuit and presented, true and complemented, to outputs of the buffer. Contemporaneously, each buffer's input is isolated from the latch circuit. Address signals are stored in input buffers until the write_bar signal returns high and the write cycle ends.

Figure 5:
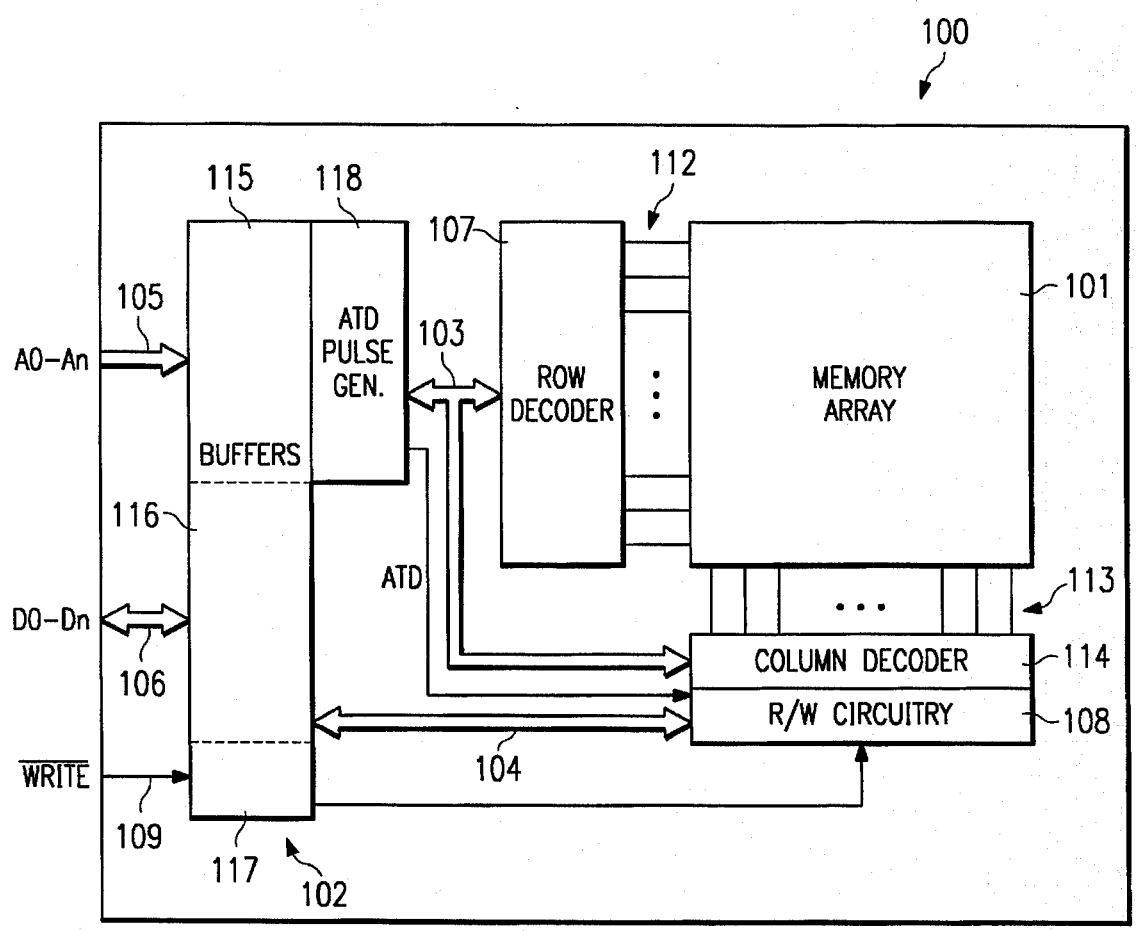
FIG. 5 is a block diagram of an integrated memory device incorporating the address buffer of FIG. 4.

FIG. 5 illustrates an example of an integrated memory device 100, in particular an asynchronous static random access memory (SRAM), having its memory cells in memory array 101, incorporating the input buffer of FIG. 4. Memory cells in memory array 101 are arranged in rows and columns (not shown). It should be noted that the designation of rows and columns in memory array 101 uses the term row to refer to the array direction in which a plurality of memory cells is selected by way of a wordline. The term column is used in this description to refer to the array direction in which one or more of the memory cells in the selected row are selected for read or write access. It is contemplated that such use of the terms rows and columns is consistent with the general understanding in the art.

Memory cells are selected by row and column decoders 107 and 114. These decoders are controlled by an internal address bus 103 exiting from address buffer 115 and address transition detection circuit 118. The address buffer 115, described above in FIG. 4, receives on its input the external address bus 105 on which are present the address signals A0–An. Address transition detection circuit 118 is connected to outputs of address buffer 115 and generates an ATD pulse signal that reaches read/write circuitry 108 and column decoder 114. Data buffer 116 is used, during read and write cycles, to transfer data to and from the memory array through the data bus 104, and data bus 106 which connects the data buffer 116 to the read/write circuitry 108. The write enable signal write_bar pass through the buffer 117 and reaches the read/write circuitry 108. Write enable signal write_bar is also connected to address buffer 115, as described in detail in FIG. 4.

Each individual input buffer 1 of FIG. 2 is thus constructed in such a manner that the write enable signal controls the output of the input buffer. Address hold problems and system constraints regarding maintaining addresses for the duration of write are thus eliminated. Moreover, after latching takes place, every kind of invalid address transitions, short or long spurious pulses caused by external or internal noises, is ignored by the buffer and does not cause incorrect switching on the output terminals. Accordingly, the actual address hold time specification for a memory device incorporating this invention is many times shorter than that for memory devices not incorporating the input buffer of this invention. The use of this buffer reduces also address input level sensitivity to noise during write. In addition, the address pins of a device incorporating this invention, during most of the time of a write cycle, could be free for other purposes, including enabling of test modes or other particular functions.

While the invention has been particularly shown and described with reference to a preferred embodiment, it will be understood by those skilled in the art that various changes in form and detail may be made therein without departing from the spirit and scope of the invention.

I claim:

1. An input buffer circuit in an asynchronous integrated memory circuit having a first input terminal receiving an input signal and a first output terminal for communicating a signal depending from the logic level of the input signal, comprising:

a control input for receiving a write enable signal;

a latch, having an input, an output and a control terminal, the output of said latch coupled to the first output of said input buffer circuit and the control terminal coupled to the control input of the input buffer circuit, so that the signal present on the input of the latch is latched responsive to the write enable signal being active; and a first pass gate coupled between said first input terminal of the input buffer circuit and the input of said latch, said first pass gate controlled by the control input of the input buffer circuit so that the pass gate is nonconductive responsive to the write enable signal being active.

2. The input buffer circuit of claim 1 further comprising a second output terminal coupled to the output of the latch, said first and second output terminals communicating complementary logic level output signals.

3. The input buffer circuit of claim 2 wherein said second output terminal is coupled to the input of the latch by means of an inverting gate.

4. The input buffer circuit of claim 1 wherein the first pass gate is connected in series with a logic stage between said first input terminal of the input buffer circuit and the input of said latch.

5. The input buffer circuit of claim 4 wherein the logic stage includes three inverting gates connected in series.

6. The input buffer circuit of claim 1 wherein the latch comprises:

two inverting gates connected in series between the input and the output of said latch; and a second pass gate coupled between the input and the output of said latch, said second pass gate controlled by the control input of the input buffer circuit so that the pass gate is conductive when the write enable signal is active.

7. The input buffer circuit of claim 6 wherein the second pass gate includes a p-channel transistor having its source-drain path connected in parallel with the source-drain path of an n-channel transistor, the gate of the p-channel transistor being controlled by the write enable signal and the gate of the n-channel transistor being controlled by the write enable signal inverted by an inverting gate.

8. The input buffer circuit of claim 1 wherein the first pass gate includes a p-channel transistor having its source-drain path connected in parallel with the source-drain path of an n-channel transistor, the gate of the n-channel transistor being controlled by the write enable signal and the gate of the p-channel transistor being controlled by the write enable signal inverted by an inverting gate.

9. The input buffer circuit of claim 1 wherein said asynchronous integrated memory circuit is a static random access memory.

10. The input buffer circuit of claim 1 wherein said input signal is an address signal.

11. A method for controlling the buffering of an input signal at an input terminal of an asynchronous integrated memory circuit, said integrated circuit incorporating a memory circuit having a write enable input for receiving a write enable signal, comprising:

applying an input signal to said input terminal; and latching a signal logically related to the input signal into a latch, said latch having an output coupled to a node of said integrated circuit, and isolating said input terminal from the latch, responsive to the write enable input receiving the write enable signal.

12. The method of claim 11 wherein receiving the write enable signal occurs upon a new write cycle of the memory circuit.

13. The method of claim 11 wherein said isolating step is performed by controlling a pass gate coupled between said input terminal and said latch.

14. The method of claim 11 wherein said asynchronous integrated memory circuit is a static random access memory.

15. The method of claim 11 wherein said input signal is an address signal.

16. An asynchronous integrated memory device comprising:

row and column decoders;

read/write circuitry having a write enable input for receiving a write enable signal;

data and control signal buffers used to generate control signals for the row and column decoders and for the read/write circuitry;

a memory array comprised of a plurality of memory cells, wherein said row and column decoders and read/write circuitry are used to access said memory array;

a plurality of input buffers each comprising:
  a first input for receiving an address signal;
  a control input for receiving a write enable signal;
  an output for communicating a signal depending from the logic level of the address signal;
  a latch, having an input, an output and a control terminal, for latching and presenting to the output of the buffer a signal logically related to the address signal, responsive to the control input receiving the write enable signal; and
  a first pass gate for isolating said first input from the latch, responsive to the control input receiving the write enable signal.

17. The asynchronous integrated memory device of claim 16 wherein receiving the write enable signal occurs upon a new write cycle in the memory array.

18. The asynchronous integrated memory device of claim 16 wherein said at least one input buffer further comprises a second output for communicating a signal opposite to the logic level present on the first output.

19. The asynchronous integrated memory device of claim 18 wherein the second output is coupled to the input of the latch by means of a logic gate.

20. The asynchronous integrated memory device of claim 16 wherein the first pass gate is connected in series with a logic stage between said first input of said at least one input buffer and the input of said latch.

21. The asynchronous integrated memory device of claim 20 wherein the logic stage includes three inverting gates connected in series.

22. The asynchronous integrated memory device of claim 16 wherein the latch comprises:

two inverting gates connected in series between the input and the output of said latch; and a second pass gate coupled between the input and the output of said latch, said second pass gate controlled by the control input so that the pass gate is conductive when the write enable signal is active.

23. The asynchronous integrated memory device of claim 22 wherein the second pass gate includes a p-channel transistor having its source-drain path connected in parallel with the source-drain path of an n-channel transistor, the gate of the p-channel transistor being controlled by the write enable signal and the gate of the n-channel transistor being controlled by the write enable signal inverted by an inverting gate.

24. The asynchronous integrated memory device of claim 16 wherein the first pass gate includes a p-channel transistor having its source-drain path connected in parallel with the source-drain path of an n-channel transistor, the gate of the n-channel transistor being controlled by the write enable signal and the gate of the p-channel transistor being controlled by the write enable signal inverted by an inverting gate.

25. The asynchronous integrated memory device of claim 16 further comprising:

a transition detection circuit having a plurality of inputs connected to a plurality of outputs of said plurality of input buffers for generating a transition detection signal coupled to said read/write circuitry.

26. The asynchronous integrated memory device of claim 16 further comprising:

a transition detection circuit having a plurality of inputs connected to a plurality of inputs of said plurality of input buffers for generating a transition detection signal coupled to said read/write circuitry, wherein said transition detection signal is logically combined with the write enable signal before reaching the read/write circuitry.

* * * * *